United States Patent
Moran

[19]

[11] Patent Number: 6,149,443
[45] Date of Patent: Nov. 21, 2000

[54] GROUND CONNECTION APPARATUS

[75] Inventor: Sean A. Moran, San Diego, Calif.

[73] Assignee: Qualcomm Incorporated, San Diego, Calif.

[21] Appl. No.: 08/938,787

[22] Filed: Sep. 26, 1997

[51] Int. Cl.$^7$ .............................. H01R 9/09; H01R 23/68
[52] U.S. Cl. ................................. 439/66; 439/92
[58] Field of Search ................................ 439/92, 108, 65, 439/66, 948, 947, 91, 515

[56] References Cited

U.S. PATENT DOCUMENTS

| | | | |
|---|---|---|---|
| 4,511,196 | 4/1985 | Schuler et al. | 339/14 |
| 5,152,694 | 10/1992 | Bargain | 439/66 |
| 5,378,160 | 1/1995 | Yumibe et al. | 439/66 |
| 5,380,210 | 1/1995 | Grabbe et al. | 439/66 |
| 5,427,535 | 6/1995 | Sinclair | 439/66 |
| 5,437,556 | 8/1995 | Bargain et al. | 439/66 |
| 5,752,841 | 5/1998 | Hori | 439/108 |

FOREIGN PATENT DOCUMENTS 0359223  9/1989  European Pat. Off. ........ H01R 23/72

*Primary Examiner*—Paula Bradley
*Assistant Examiner*—Alexander Gilman
*Attorney, Agent, or Firm*—Russell B. Miller; Roger W. Martin; Tom Streeter

[57] ABSTRACT

A ground connector and standoff apparatus or spring member for mounting between two circuit boards is of conductive material and has opposing substantially flat, parallel first and second legs and a spring link connecting the legs. In an uncompressed condition of the spring member, the legs are spaced apart a predetermined distance greater than the spacing between the two circuit boards when connected together. The first leg is connected to one of the circuit boards and the second leg bears against an opposing portion of the other circuit board to provide a ground connection when the boards are connected together, compressing the spring member. A limiter or spacer on the spring member limits compression beyond a predetermined point at which the height of the spring member is equal to a predetermined standoff between the boards.

5 Claims, 1 Drawing Sheet

GROUND CONNECTION APPARATUS

BACKGROUND OF THE INVENTION

The present invention relates generally to the interconnection between two adjacent circuit boards such as a keyboard and an underlying main printed wiring board (PWB) for a computer, portable phone, calculator or the like, and is particularly concerned with ground connection between such boards.

A keyboard and underlying PWB are generally secured together by a series of screws or other fastener devices such that the keyboard is spaced a small distance above the PWB so as to be clear of components on the PWB. Since the base of the keyboard is of a material having some flexibility, some deflection may occur when the user depresses keys. In order to resist such deflection, the underlying PWB may be provided with bumps or protrusions to provide a predetermined "standoff" between the boards and prevent the keyboard from deflecting too far. In addition, both of the boards must be suitably grounded.

SUMMARY OF THE INVENTION

It is an object of the present invention to provide a new and improved standoff and ground connection apparatus for a pair of connected printed wiring boards or circuit boards, such as a keyboard and an underlying main PWB.

According to the present invention, a ground connector and standoff device is provided, which comprises a spring member having opposing substantially flat, parallel first and second legs and a spring link connecting the legs, whereby the legs are spaced apart a predetermined distance when the spring link is not compressed, the first leg being adapted for connection to a ground pad on one of a pair of connected circuit boards and the second leg being adapted to bear against an opposing portion of the other circuit board, and a limiter member for limiting the compression of the spring link so as to maintain a predetermined standoff between the two boards.

In one embodiment of the invention, the spring member is substantially S-shaped, with the upper and lower portions of the S comprising the first and second legs and the serpentine connecting portion of the S comprising the spring link. A pair of substantially rigid side flaps depend downwardly from opposite sides of one of the legs towards the other leg to provide the limiter member. Once the spring link is compressed sufficiently, the free ends of the side flaps engage opposing portions of the second leg, which is wider than the first leg, and prevent any further compression, thus resisting any further deflection of an associated circuit board.

In another embodiment of the invention, the spring member is generally C-shaped, with upper and lower portions of the C comprising the first and second legs and the left-hand, curved portion of the C comprising the spring link. In this case, the limiter member comprises a projection or flap at the free end of one of the legs which extends towards the other leg. When the C-shaped spring is compressed sufficiently, the free end of the projection engages the opposing leg and prevents any further compression.

In each case, the spring member is of conductive material, for example a relatively thin, sheet metal material, so that one of the legs can be secured to a pad on one circuit board so as to provide a ground connection to an opposing ground pad or portion on the other circuit board. At the same time, a predetermined standoff between the boards is maintained by the limiter.

According to another aspect of the invention, a circuit board assembly is provided which comprises first and second circuit boards secured together with a predetermined spacing between the boards, each board having an pad on an inner surface facing the pad on the other board, one of the pads comprising a ground pad connected to ground, and at least one ground connector and standoff device connected between the boards, the device comprising a spring clip of conductive material having first and second, parallel spaced legs and a resilient link connected between the legs, the first leg being connected to the pad on one board and the second leg bearing against the pad on the other board to provide a ground connection between the boards, the resilient link being compressed, and a limiter member secured to the spring clip to limit compression of the resilient link beyond a predetermined amount so as to provide a predetermined standoff between the boards.

The standoff and ground connection device is secured to one of the boards before they are connected together. The uncompressed height of the device is greater than the separation between the boards when they are connected, so that the resilient link is compressed when the boards are connected, biasing the device against a ground pad on the second board and ensuring that a good ground connection is made. At the same time, the limiter member will resist deflection of one board towards the other beyond a predetermined point, to provide a standoff.

More than one of the spring members may be provided at spaced intervals between the boards, so as to resist deflection as a result of the user depressing keys, for example, when one of the boards is a keypad. This arrangement both provides support for a keyboard structure and also maintains an electrical ground between the two boards. Keyboard strength is typically low, so support is needed to help reduce deflection of such boards. At the same time, an electrical ground connection between the boards is required. This device provides both of those requirements in a simple, one piece member which is inexpensive and easy to install.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
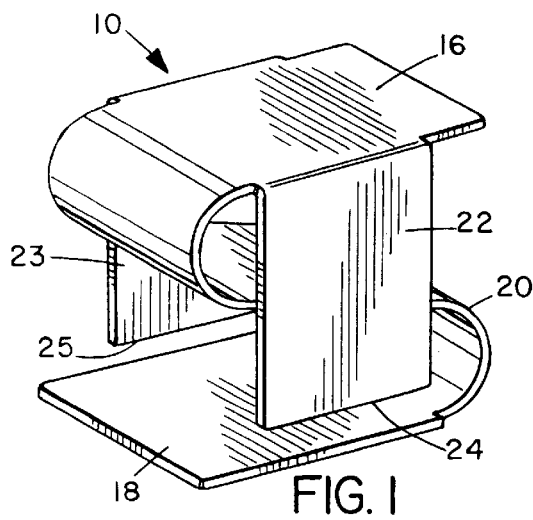
FIG. 1 is a perspective view of a preferred configuration of the ground connector.
Figure 2:
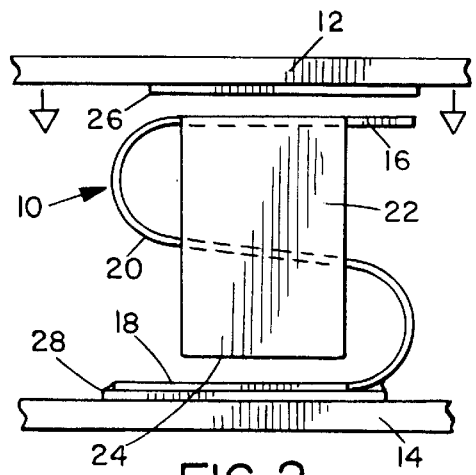
FIG. 2 is a side view showing the clip attached to a motherboard, with the associated circuit board in position for connection.
Figure 3:
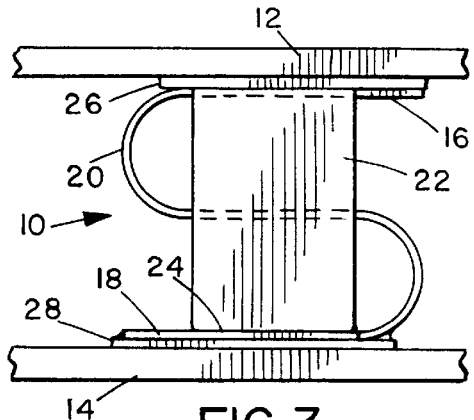
FIG. 3 is a view similar to FIG. 2, with the boards and connector fully seated.

FIGS. 1–4 of the drawings illustrate a ground connector and standoff device 10 according to a first embodiment of the present invention. FIG. 1 illustrates the device 10 on its own, while FIGS. 2–3 illustrate installation between two circuit boards 12,14, such as a keyboard and underlying main printed wiring board or PWB.

The ground connector and standoff device 10 basically comprises a spring of conductive material which is generally S-shaped, having first and second generally flat, parallel legs 16,18 comprising the upper and lower portions of the S, and a serpentine, resilient link 20 connecting the two legs. A pair of relatively rigid side flaps 22,23 depend downwardly from opposite sides of the upper leg 16 and have free ends 24,25 which terminate short of the lower leg 18 when the spring clip is in an uncompressed state, as in FIGS. 1 and 2. The spring 10 is of a suitable conductive material, such as conductive sheet metal. Preferably, the lower leg 18 is wider than the upper leg, as best illustrated in FIGS. 1 and 4.

Figure 4:
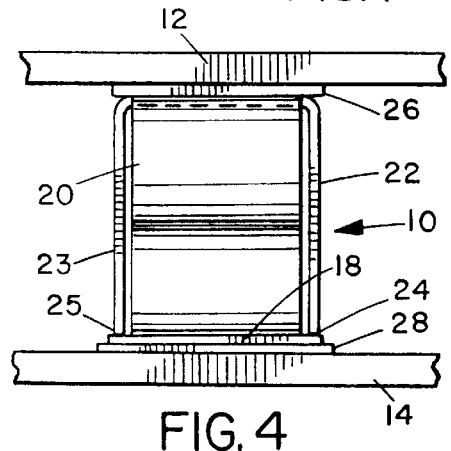
FIG. 4 is a view as taken from the left-hand side of FIG. 3.

The device or spring 10 is mounted between the two boards 12 and 14 as illustrated in FIGS. 2–4. A keyboard and an underlying main printed wiring board 12,14, respectively are generally secured together by suitable fasteners (not illustrated) with a predetermined spacing between the boards to prevent damage to underlying components. In the illustrated embodiment, the keyboard 12 is provided with a ground pad 26 connected to ground, and the printed wiring board 14 is provided with an opposing conductive pad 28. Prior to attachment of the two boards, the lower leg 18 of spring clip 10 is suitably soldered to the pad 28 on board 14. It will be understood that more than one spring clip may be provided if desired, and in that case the two boards will be provided with multiple, spaced pairs of opposing pads. The second board is then brought towards the first board in the direction of the arrows in FIG. 2, and the ground pad 26 will engage the upper leg 16 of the spring clip.

The uncompressed height of the spring member 10 is designed to be greater than the normal separation between the boards when they are fully secured together as in FIG. 3. Thus, as the boards are secured together, the spring clip 10 will be compressed somewhat. When a user pushes on the keys, thereby deflecting the keyboard, the free ends 24,25 of the side flaps will contact the leg 18, resisting any further compression of the spring clip, as illustrated in FIGS. 3 and 4. Due to the compression of the spring clip, the upper leg 16 is biased against ground pad 26, ensuring and maintaining a good ground connection. At the same time, the side flaps 22,23 will act as limiters to maintain a predetermined standoff between the boards. Thus, this provides a simple, one-piece device for performing the two required functions of a ground connection between the boards and limiting deflection of the keyboard, which is of low strength and typically relatively flexible.

Figure 5:
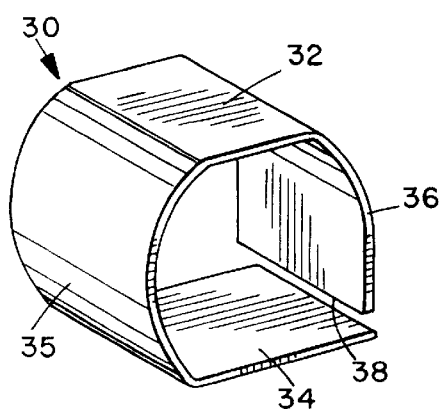
FIG. 5 is a perspective view of another configuration of the connector.
Figure 6:
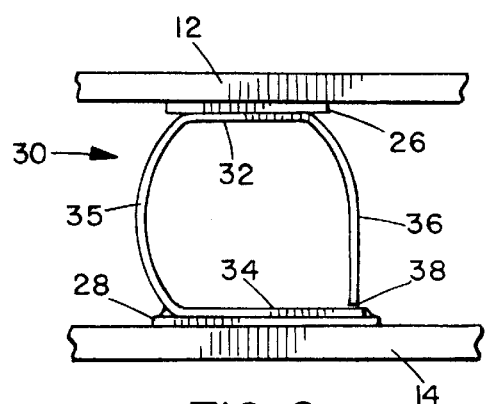
FIG. 6 is a side view showing the assembly using the connector of FIG. 5.

FIGS. 5 and 6 illustrate a ground connection and standoff device or spring member 30 according to a second embodiment of the invention. In this case, the spring member 30 is generally C-shaped and has upper and lower parallel, generally flat, spaced legs 32,34 connected by arcuate, resilient portion 35. The lower leg 34 is longer than upper leg 32, and a limiter flap 36 projects downwardly from the free end of the upper leg towards the lower leg, with the free end 38 of flap 36 terminating short of lower leg 34 when the device is in an uncompressed state, as in FIG. 5.

The device 30 is installed between two circuit boards 12,14, such as a keyboard and underlying main printed wiring board, in a similar manner to the previous embodiment. The lower leg 34 is suitably mounted on a conductive pad 28 on board 14 by soldering or the like, prior to connection of the two boards. As in the previous embodiment, the height of the device 30 in its uncompressed condition will be greater than the separation between the boards 12,14 when they are connected together as in FIG. 4. The pad 28 is positioned opposite a ground pad 26 on the other board 12, and when the two boards are secured together, the upper leg 34 will first contact the pad 26, and the device 30 will then start to compress, until the free end 38 of limiter flap 36 contacts leg 34, limiting further compression. The height of the device 30 in its fully compressed state is therefore equal to the desired standoff or separation between the boards, and the device 30 has the dual functions of providing a reliable ground connection between the boards as well as a standoff to limit deflection of the keyboard 12.

It will be understood that the ground pad may be provided on either the upper board or the lower board, and that the ground connection and standoff device 10 or 30 may be secured to the pad on the upper board rather than the lower board in alternative embodiments. In each case, the device is a simple, inexpensive one-piece member which can be readily installed in the space between interconnected circuit boards to provide the necessary ground connection as well as the required standoff. More than one of the devices may be installed at spaced intervals between two circuit boards, as required. Due to the compression of the device when the boards are connected together, it is biased against the ground pad to ensure that a reliable ground connection is maintained, even in the event of some relative deflection of the two boards as can commonly occur during use.

Although some preferred embodiments of the invention have been described above by way of example only, it will be understood that modifications may be made to the disclosed embodiments without departing from the scope of the present invention, which is defined by the appended claims.

I claim:

1. A ground connector and standoff apparatus for mounting between two circuit boards, the apparatus comprising:
    (a) a spring member of conductive material having opposing substantially flat, parallel first and second legs and a spring link connecting the legs, whereby the legs are spaced apart a predetermined distance greater than the spacing between two circuit boards when the spring link is not compressed;
    (b) the first leg being adapted for connection to one of a pair of connected circuit boards and the second leg being adapted to bear against an opposing portion of the other circuit board to provide a ground connection; and
    (c) a limiter device for limiting the compression of the spring link so as to maintain a predetermined standoff between the two boards; wherein:
    (d) the spring member is substantially S-shaped, having upper and lower portions of the S-shape comprising the first and second legs and a serpentine connecting portion of the S-shape comprising the spring link;
    (e) the limiter device comprises at least one side flap depending from one of the legs towards the other leg, the side flap terminating short of the other leg in an uncompressed condition of the spring member and comprising means for resisting further compression of the spring member when said spring member is compressed to a predetermined height in which the side flap contacts the other leg; and
    (f) a pair of substantially rigid side flaps depend downwardly from opposite sides of the first leg towards the second leg, each side flap having a free end terminating short of the second leg in the uncompressed condition of the spring member.

2. The apparatus as claimed in claim 1, wherein the second leg is wider than the first leg and the free ends of the side flap contact the second leg when the spring member is in said compressed condition.

3. A circuit board assembly, comprising:
   (a) first and second circuit boards secured together with a predetermined spacing between the boards, each board having an pad on an inner surface facing the pad on the other board;
   (b) one of the pads comprising a ground pad connected to ground;
   (c) at least one ground connector and standoff device connected between the boards, the device comprising a spring member of conductive material having first and second, parallel spaced legs and a resilient link connected between the legs, the first leg being connected to the pad on one board and the second leg bearing against the pad on the other board to provide a ground connection between the boards, the resilient link being compressed, and
   (d) a limiter secured to the spring clip to limit compression of the resilient link beyond a predetermined amount so as to provide a predetermined standoff between the boards; wherein:
   (e) the spring member is S-shaped;
   (f) the S-shaped spring member has upper and lower portions comprising said first and second legs, respectively, and a serpentine, resilient connecting portion between said upper and lower portions comprising said resilient link;
   (g) said first leg has opposite sides, and at least one side flap depending downwardly from one of said sides towards said second leg, said side flap comprising said limiter, and having a free end terminating short of said contacting said second leg to limit further compression of said spring member when said spring member is compressed to a predetermined height: and
   (h) said first leg has side flaps depending downwardly from both sides.

4. The assembly as claimed in claim 3, wherein the limiter comprises a flap projecting from one of the legs towards the other leg, the flap having a free end terminating short of the other leg in an uncompressed condition of the spring member, and contacting the other leg to limit further compression when the spring member is compressed by a predetermined amount.

5. The assembly as claimed in claim 4, wherein said one leg is shorter than said other leg.

* * * * *